United States Patent [19]
Sebald et al.

[11] Patent Number: 5,234,793
[45] Date of Patent: Aug. 10, 1993

[54] METHOD FOR DIMENSIONALLY ACCURATE STRUCTURE TRANSFER IN BILAYER TECHNIQUE WHEREIN A TREATING STEP WITH A BULGING AGENT IS EMPLOYED AFTER DEVELOPMENT

[75] Inventors: Michael Sebald, Hessdorf-Hannberg; Recai Sezi, Roettenbach; Rainer Leuschner, Grossenseebach; Siegfried Birkle, Hoechstadt A/Aisch; Hellmut Ahne, Roettenbach, all of Fed. Rep. of Germany

[73] Assignee: Siemens Aktiengesellschaft, Munich

[21] Appl. No.: 513,965

[22] Filed: Apr. 24, 1990

[30] Foreign Application Priority Data

Apr. 24, 1989 [DE] Fed. Rep. of Germany ....... 3913432

[51] Int. Cl.$^5$ ............................ G03F 7/36; G03F 7/23; B44C 1/22
[52] U.S. Cl. .................................... 430/323; 430/166; 430/191; 430/192; 430/193; 430/326; 156/643; 156/646; 156/660
[58] Field of Search ............... 430/323, 313, 325, 326, 430/192, 193, 166; 156/643, 660, 661.1, 646

[56] References Cited

U.S. PATENT DOCUMENTS

| | | | |
|---|---|---|---|
| 4,552,833 | 11/1985 | Ito et al. | 430/325 |
| 4,613,398 | 9/1986 | Chiong et al. | 430/323 |
| 4,657,845 | 4/1987 | Frechet et al. | 430/326 |
| 4,690,838 | 9/1987 | Hiraoka et al. | 430/323 |
| 4,737,425 | 4/1988 | Lin et al. | 430/11 |
| 4,782,008 | 11/1988 | Babich et al. | 430/313 |
| 4,808,511 | 2/1989 | Holmes | 430/323 |
| 4,931,351 | 6/1990 | McColgin et al. | 430/323 |
| 4,999,280 | 3/1991 | Hiraoka et al. | 430/323 |
| 5,173,393 | 12/1992 | Sezi et al. | 430/323 |

FOREIGN PATENT DOCUMENTS

| | | |
|---|---|---|
| 0136130 | 4/1985 | European Pat. Off. |
| 0249769 | 12/1987 | European Pat. Off. |
| 0274757 | 8/1988 | European Pat. Off. |
| 0285797 | 10/1988 | European Pat. Off. |
| 0315375 | 5/1989 | European Pat. Off. |
| 2916384 | 11/1979 | Fed. Rep. of Germany. |
| 3036710 | 5/1982 | Fed. Rep. of Germany. |
| 3724368 | 2/1989 | Fed. Rep. of Germany. |
| 614314 | 11/1979 | Switzerland. |

OTHER PUBLICATIONS

Sezi et al, Positive Near-UV Resist for Bilayer Lithography, SPIE, vol. 811, Optical Microlithographic Technology for Integrated Circuit Fabrication and Inspection (1987), 172–179.
Quantified Solvent Swelling of Polymer Films, IBM Technical Disclosure Bulletin, vol. 27, No. 12, May 1985, 7261–7262.
Alling et al, Image Reversal Photoresist, Solid State Technology/Jun. 1988, 37–38.
Fredericks et al, Deep UV Resists, IBM Technical Disclosure Bulletin, vol. 23, No. 9, Feb. 1981, 4132.
Contrast Enhancement of Resist Images by Surface Crosslinkage, IBM Technical Disclosure Bulletin, vol. 31, No, 3, Aug. 1988, 349.
Leonard et al, Automated In-Line Puddle Development of Positive Photoresists, Solid State Technology/-Jun. 1981, 99–102.
Radiation-Curable Polysiloxanes, IBM Technical Disclosure Bulletin, vol. 30, No. 3, Aug. 1987, 1041–1042.
Reichmanis et al, Approaches to Resists for Two-Level RIE Pattern Transfer Applications, Solid State Technology/Aug. 1985, 130–135.
Tilenschi, Kriterien zur Beurteilung von Plasmaatszystemen, Productornic Apr. 1987, 66–69.

Primary Examiner—Charles L. Bowers, Jr.
Assistant Examiner—John S. Chu
Attorney, Agent, or Firm—Hill, Steadman & Simpson

[57] ABSTRACT

A photolithographic method for structure generation in bilayer processes is provided. Pursuant to the method, a dimensional reserve is produced in a top resist structure by chemical treatment with a bulging agent. The expansion preferably is performed by treatment with an aqueous solution. The expansion can be set such that the dimensional loss to be anticipated in further etchings of the bottom resist or, respectively, of the wafer is exactly compensated for.

20 Claims, 1 Drawing Sheet

METHOD FOR DIMENSIONALLY ACCURATE STRUCTURE TRANSFER IN BILAYER TECHNIQUE WHEREIN A TREATING STEP WITH A BULGING AGENT IS EMPLOYED AFTER DEVELOPMENT

BACKGROUND OF THE INVENTION

The present invention relates to methods for the dimensionally accurate photolithographic transfer of sub-$\mu$m structures through a bilayer technique.

In the photolithic production of resist structures, the resolution, i.e., the smallest possible structure that can be imaged (critical dimension=CD), is defined by a number of parameters. These parameters are the photolithographic properties of the resist, the wavelength ($\gamma$) of the light used for the exposure, the numerical aperture (NA) of the imaging optics, and the reflective behavior of the light at phase boundaries between two materials having different optical density.

As demonstrated by the following equations, that are dependent on one another, a high structure resolution can be achieved by using a shorter wavelength or a larger numerical aperture. However, on the other hand, focal depth decreases by an even greater degree, so that the advantages of using radiation having a short wavelength can only be achieved in extremely thin resist films having a high uniform thickness.

$$CD = f_1 \frac{\lambda}{NA} \; ; \; DOF = f_2 \frac{\lambda}{(NA)^2}$$

In the above equations, parameters $f_1$ and $f_2$ are factors that are associated with the method and system. These parameters only slightly vary given the systems that are presently optimized. In the above equations, DOF references the depth of focus.

Chemical factors determine the quality, the uniformity of the distribution, and the penetration depth of the (chemical action) of the light in the resist. The particular chemical factors include the solubility differences between irradiated and non-irradiated regions during development with gaseous or liquid agents. With respect to the selection of liquid developing agents, it is desirable that the agent is selected such that there is a low capacity for swelling of the resist, as well as, a high selectivity between irradiated and non-irradiated resist regions.

A high resolution can be achieved using positive photoresists that, among other things, are distinguished by a low intrinsic absorption of the basic polymer at the irradiation wavelength and by a good bleaching behavior of photo-active constituents during irradiation.

By varying such parameters as irradiation duration and the developing process, further variations of the photostructuring method are possible. It is also possible to attempt to optimize the resolution of a resist by varying the type of developer and the development conditions.

Although the above variations are possible in an attempt to optimize the resolution of the resist, even given a resist that optimally resolves in a uniformly thin layer on a planar substrate in single-layer technique, the resolution is drastically reduced when the resist is applied onto substrate having substrate steps and surfaces that reflect differently. Such reflections lead to exposure in undesired regions and, thus, generates an image that is not sharp.

The use of a bilayer technique can avoid these problems. In a bilayer technique, the photoresist to be structured is applied in a thin layer as a top resist over a lower, planarizing, first resist layer (a bottom resist). The top resist structure is produced in a normal manner and is ultimately transferred into the bottom resist structure in an anisotropic etching process; for example, in an oxygen/RIE plasma, wherein the top resist structure functions as an etching mask.

Because of the isotropic portion, that cannot be avoided in the etching step that otherwise acts predominantly anisotropically, an under-etching of the bottom resist structures occurs. This results in side walls having a concave structure.

It is known, in some bilayer methods, to use silicon-containing top resists having about 10 weight percent of silicon. During the development and following transfer of the structure into the bottom resist, however, the transfer only results in structures that are at least 10 percent narrower than the structures prescribed on the mask.

European Patent Application No. EP A 0 136 130 discloses a method wherein a top resist structure, composed of novolak, is treated with gaseous titanium chloride in order to improve its etching resistance to an $O_2$—RIE etching plasma. However, because of the reaction of the top resist with the titanium chloride, that only superficially occurs, there is a lateral loss in dimension upon transfer of the top resist structures onto the bottom resist with this method. Such a lateral loss is not acceptable in sub-$\mu$m structures in the range of 0.5 $\mu$m. Moreover, due to an incomplete conversion of the hydrolyzable chlorine at the titanium, a later contamination of the wafer or of the apparatus with HCl in a following process step is possible.

U.S. Pat. No. 4,690,838 proposes a method for the quality enhancement of top resist structures. The top resist is treated with gaseous reactants such as hexamethyldisilazane, chlorosilanes, or aminosilanes after the development. Again, a lateral loss in dimension arises in the transfer of structure since the quality enhancement occurs only at the surface or at phase boundaries.

An article by Sezi et al, in SPIE, Vol. 811 (1987), pages 172–179, presents a detailed, critical discussion of known methods of bilayer techniques.

SUMMARY OF THE INVENTION

The present invention provides a method for a 1:1 structure transfer from a mask onto a wafer in a bilayer technique that is suitable for producing sub-$\mu$m structures, and is simple to implement and versatile.

To this end, a method is provided for the dimensionally accurate photolithographic transfer of sub-$\mu$m structures in a bilayer technique. The method comprising the steps of: applying a first, planarizing resist layer on a substrate, the resist being applied in a layer thickness such that an adequately planar surface is achieved; producing a photolithographically structurable, second resist layer on the first resist layer; exposing and developing the second resist layer in desired regions for generating a structure, wherein the resist includes groups that are still reactive; subjecting the resultant structure to a chemical treatment with an agent that causes a bulging of the resist structures; and using an anisotropic plasma etching process to transfer the structure into the first resist layer using the structure of the second resist layer as an etching mask.

In an embodiment, a dimensional reserve is produced due to the bulging of the structure that exactly corresponds to a dimensional loss caused by the structure transfer from the second into the first resist layer, or into the substrate.

In an embodiment, the extent of structure expansion of the second resist layer is controlled by controlling the duration of the chemical treatment.

In an embodiment, the chemical treatment is performed with a solution or emulsion that contains a bulging agent.

In an embodiment, the chemical treatment is performed in the vapor phase.

In an embodiment, the chemical treatment of the second resist layer proceeds with a solution or emulsion containing a bulging agent in a spray, puddle, or immersion developer.

In an embodiment, the degree of expansion of the structure is controlled by controlling the concentration of the bulging agent.

In an embodiment, the chemical treatment is performed with a bulging agent that contains at least one functional group. In an embodiment, the agent includes a component that increases the etching resistance of the resist to an oxygen/RIE plasma. In an embodiment, the agent contains silicon-containing radicals.

In an embodiment, the resist of the second resist layer includes a component that increases the etching resistance and the chemical treatment is performed with an agent that does not contain such a component.

In an embodiment, a resist is used for the second resist layer that includes at least one functional group per molecule for reaction with the bulging agent, the functional group is selected from the group consisting of anhydride, imide, ester, amide, ketene, amine, oxirane, phenol, thioester, urethane, and carbonic acid.

In an embodiment, an amino siloxane having 1 to 50 silicon atoms is used as a bulging agent for a second resist containing anhydride. In a preferred embodiment, the amino siloxane includes 2 to 12 silicon atoms.

In an embodiment, the bulging agent contains at least one functional group for reaction with a polymer of the second resist, the functional group is selected from the group consisting of alcohol, amine thiole, carbonic acid, glycidylether, anhydride, imide, isocyanate, urethane, and ketene.

In an embodiment, the trenches and holes in the second resist structure are constricted by the bulging of the second resist structure so that their width lies below the normal resolution limit.

In an embodiment of the method, a floodlighting is used before the chemical treatment for increasing the expansion rate in the chemical treatment.

In an embodiment of the method, the chemical treatment is controlled by controlling the temperature.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
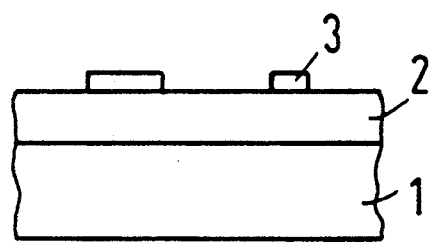
FIG. 1 illustrates a cross-sectional view of a structure after a step of the method of the present invention.

The present invention provides an improved method for the transfer of a structure from a mask to a wafer in a bilayer technique.

The method comprises the steps of: applying a first, planarizing resist layer on a substrate, the layer being applied in a layer thickness such that an adequately planar surface is achieved; producing a photolithographically structurable second resist layer; exposing and developing the second resist layer in desired regions for producing a structure, the resist including reactive groups; subjecting the resultant structure to chemical treatment with an agent that causes a bulging of the resist structure; and using an anisotropic plasma etching method to transfer the structure into the first resist layer using the structure of the second resist layer as an etching mask.

In the method of the present invention, a dimensional reserve, that precisely corresponds to the dimensional loss that is produced by the structure transfer from the second into the first resist layer or into the substrate, is generated by the bulging of the structure.

Due to the present invention, a dimensional loss in the structure transfer from the top resist into the bottom resist, or into the wafer, can be accepted for the first time. This is due to the fact that any and all dimensional losses can be compensated for with the structural expansion caused by the method of the present invention. This structural expansion being based on the chemical treatment. The present invention provides a 1:1 structure transfer relative to the mask that is one hundred percent exact.

An advantage of the method of the present invention is that it is not difficult to implement and can be used with currently available apparatus. Additionally, compared to the simplest bilayer technique, the method only comprises one additional method step. A further advantage of the method of the invention is that it is not as dependent on the development time of the top resist as prior methods Whereas an over-development of the top resist structures has to be strictly avoided in prior methods, a longer development time can now be set and, thus, work can be performed in a region wherein material erosion during the developing process exhibits a low dependency on the development duration. A further parameter is therefore not critical and, thus, dimensional accuracy of the generated structures can be achieved.

When the photoresist structures are bulged, the layer thickness of the structures is also simultaneously increased. Likewise, the erosion of these structures in the etching plasma is thus prevented.

Preferably, the chemical treatment of the photoresist is performed with a solution or emulsion that contains a bulging agent in a medium that is aqueous or at least contains water. This increases the simplicity of the method in that the conditions for chemical treatment can be easily set. The aqueous medium of the bulging agent allows the implementation of the chemical treatment in an open apparatus, since there are no groups that are sensitive to hydrolysis that have to be protected, no over-pressure or under-pressure has to be set, and neither elevated temperatures nor complicated apparatus are required. In particular, the treatment can be implemented in known systems for spray, puddle, or immersion developing. Standard systems include such apparatus so that no further equipment or special apparatus are required to use the method.

Pursuant to the present invention, the chemical treatment can also be implemented with an agent that is present in some other organic solvent or in the vapor phase.

The degree of the bulging of the top resist structures, as well as control of the chemical treatment, can be set via the duration of the treatment. The rate of the bulging reaction depends on, among other things, the diffusion rate of the bulging agent into the top resist structure. Diffusion-controlled reactions, particularly heterogeneous reactions (solid resist/liquid agent) as in the present case, are sufficiently slow, that an exact control of the bulging structure of the photoresist is possible via the treatment duration. At the same time, treatments of from a few seconds up to about 5 minutes only lead to a relatively slight lengthening of the overall duration in the method for generating structures.

In addition to being dependent on the duration of the chemical treatment, the bulging is also dependent on the concentration of the bulging agent and on the treatment temperature. Although the method can proceed at ambient temperature, the rate of the bulging can be increased, or the treatment duration can be shortened, utilizing elevated temperatures.

A further increase in the bulging rate, or the bulging itself, can be achieved when the resist structure is floodlighted before the bulging. This will, for example, photochemically activate the photoactive components present in this structure and thus lead to an acceleration of the diffusion of the agent into the resist. By contrast, an improved resolution of the photoresist structure can be achieved by an over-development and subsequent, correspondingly greater bulging.

The bulging process is terminated by rinsing the expanded structures with water or a suitable solvent for the bulging agent. Subsequently, the expanded structure is dried in order to eliminate solvent residues.

Because expansion of the top resist structures is accompanied by a chemical modification of the top resist, it is also advantageous to improve the chemical-physical properties of the top resist, as desired, simultaneously with the bulging. In particular, the etching resistance of the top resist to the plasma etching method can be increased. To this end, when the etching plasma includes oxygen, silicon-containing groups can be bonded to the top resist to increase the resistance to the etching. Non-volatile silicon dioxide results therefrom in oxygen plasma, the silicon dioxide remains on the structures and prevents a further erosion of resist material lying therebelow. Other elements, particularly metals, can also increase the etching resistance of the photoresist.

In selecting a material for the second resist layer (top resist) in the present invention a variety of materials can be selected as long as they meet the requirements set forth below. First, the material must satisfy the photolithographic requirements and must be easily structurable. It is not important whether the resist works positively or negatively with respect to the imaging exposure. The material must merely contain functional groups that react with the bulging agent after the development.

In selecting the material, the top resist structure, as well as the bottom resist, must be selected so that they do not dissolve in the bulging agent or the solvent thereof, during the bulging process. On the other hand, the material must have such a chemical structure that a diffusion of the bulging agent into he top resist structure is promoted. An adequately great chemical potential gradient between the bulging agent and the polymer, as well as an adequately great diffusion potential through layers of the top resist that have been expanded, is required for this purpose. The selection of suitable functional groups for the top resist is therefore dependent on the type of bulging agent that is used.

It has been found, for example, that the following groups function satisfactorily as functional groups in the top resist or as functional group in the polymer of the top resist: anhydride, imide, ester, amide, isocyanate, ketene, amine, oxirane, phenols, thioester, urethanes, and carbonic acids. These groups can be present in the resist from the very outset, or can be formed or released by chemical reaction during the course of the structuring process of the top resist.

Anhydride groups, particularly in cyclic form, have been found to have certain advantages in embodiments of the present invention. Since positively working photoresists predominantly composed of a basic polymer and of a photoactive component exhibit a better resolution than comparable negative resists, the functional group is preferably bonded to the basic polymer of a positive resist and can be located at the main chain or at side chains. The anhydride group is particularly suited for resists that are structured with light in the deep ultraviolet range (for example, below 280 nm), since the anhydride group does not exhibit an increased absorption in this wavelength range.

Although organic solvents are fundamentally suitable for the bulging agent, since they do not dissolve the resist polymer or allow it to swell and the bulging constituent in such solvents has a sufficient tendency to diffuse into the resist structure, a solvent is nonetheless preferred that is composed of pure water or at least a composition that contains water as a solvent constituent. For example, the solvent constituents can include alcohols that can be mixed with water. Of course, the solvent system should be adapted to the bulging constituent. The bulging agent need not, however, be soluble in the solvent system. To this end, it can also be present in an emulsion. Selection of the bulging agent and solvent should be chosen base on the overall system in view of the effectiveness and controllability of the bulging of the photoresist.

As the bulging agent, monomers or liquid oligomers that contain at least one component that improves the $O_2$—RIE resistance and contain at least one group that reacts with the indicated, functional groups of the resist polymer are preferably selected as suitable bulging agents. For example, compounds having the general structural formulas A through D are suitable as bulging agents:

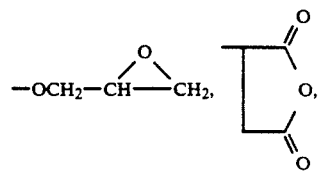

-continued

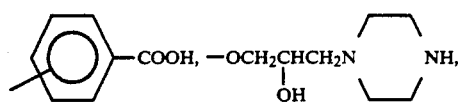

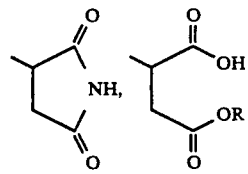

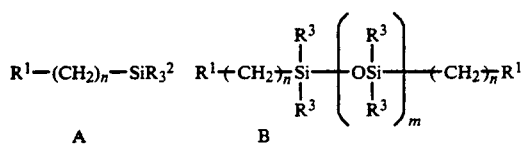

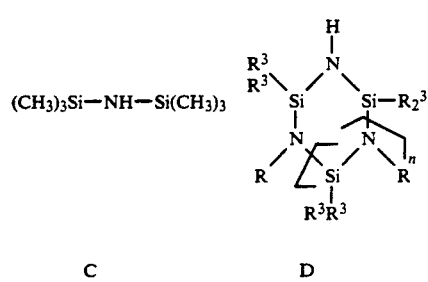

wherein:
n is 0 through 3;
R$^1$ is OH, —NH$_2$, —SH, —COOH, —NCO, —OCONH—(CH$_2$—)$_m$NCO, —C=C=O, —NH—CH$_2$—CH$_2$—NHR, —O—COCH$_2$CH$_2$—COOH, (m=1-3);
R$^2$ is methyl, phenyl, methoxy, phenyloxy, or trimethylsilyoxy;
R$^3$ is H, alkyl, aryl, or cycloalkyl; and
R is alkyl, aryl, or H.

Aliphatic diaminosiloxanes having 1 to 50, preferably having 2 to 12, silicon atoms per molecule are particularly suitable for the method of the present invention. Silses quioxanes are also suitable.

An advantage of the method of the present invention is that the bulging layer includes the highest concentration of O$_2$—RIE-resistance elements. This allows extremely high etching selectivities to be obtained.

Depending on the process, however, it can also be advantageous to treat O$_2$—RIE—resistant top resist structures with a bulging agent that does not contain components that improve the O$_2$—RIE resistance, in order to generate perpendicular structure side walls in the bottom resist that are not under-etched. The dimensional loss in the expanded top resist structures can then keep step with the under-etching of the bottom resist structure; as a result thereof steep edges can also be thereby produced. The higher layer erosion in the top resist structure, that is thereby elicited is counteracted by a correspondingly thicker bulging layer, since the bulging produces not only lateral expansion of the structures but also increased layer thicknesses.

Examples of bulging agents that are suitable include those represented by the general structural formulas E, F, G, H, and I below:

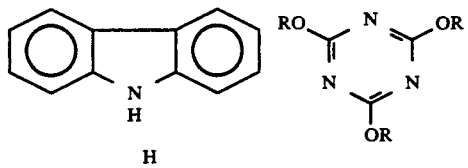

(m,o ≥ 1, n ≥ 0)

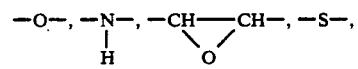

wherein:
the radicals R$^5$ are alkyl, aryl, H, or a halogen independent of one another;
R$^8$ includes the radicals

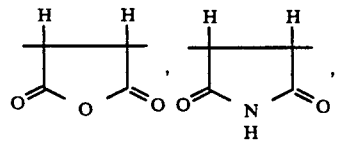

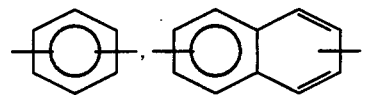

and the remaining, generally recited radicals have the aforementioned significance.

It can be, in an embodiment of the method, advantageous for less reaction-friendly functional groups to be present in the bulging agent when a catalyst is mixed with the agent. The catalyst will accelerate the reaction with the functional groups of the top resist.

If the resist contains an anhydride, a preferred bulging agent, in addition to the solvent mixture of water/alcohol, includes a diaminosiloxane with 2 to 12 silicon atoms as a bulging constituent that is preferably present in the solution in the range of from 1 to about 10 volume percent. The ratio of water to alcohol is selected such that both an adequate solubility of the bulging constituent, as well as, an adequate insolubility of the top resist structures to be treated are ensured.

Examples of polymers having functional groups that are suitable as basic polymers for top resists in the method of the present invention include those having the general structure formulas K and L, or derived from cresol novolak, epoxy novolak, polyurethane, poly(-meth)acrylates, polyesters or polyethers:

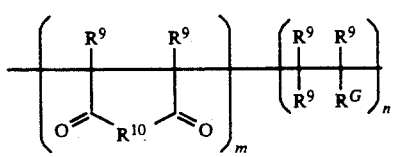

$$0 < \frac{m}{m+n} \leq 0.6$$

$$m + n = 4\text{--}200$$

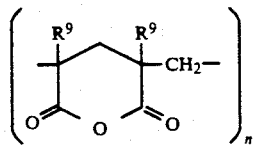

$$n = 4\text{--}300$$

wherein:

R⁹ is H, alkyl, aryl, halogen, halogen-substituted or alkyl;

R¹⁰ is O, NH, or S; and the radical R⁶ is selected from the following groups:

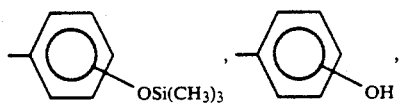

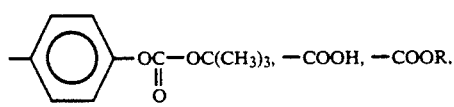, —COOH, —COOR,

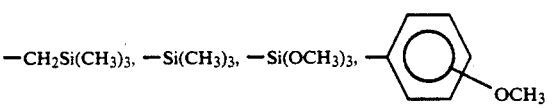

Above all, the selection of the polymers is based on the transparency to the wavelength range of the radiation. As previously mentioned, resists that contain anhydride are preferably employed in the method of the present invention for the deep ultraviolet range, for example, 248 nm. These compounds can have the aforementioned structures or can be derived from further monomers that contain anhydride, that contain a double bond as polymerizible function and, for example, have the general structures N, O, P, or Q:

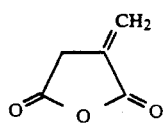 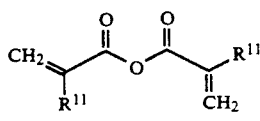

N      O

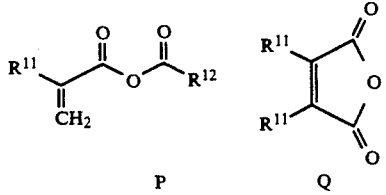

P      Q wherein:

R¹¹ is H or alkyl; and

R¹² is an alkyl or aryl radical.

The degree of the bulging can be from a few nanometers up to a few micrometers. Depending on the degree of bulging, the treatment can be performed for a few seconds through a few minutes at a temperature that can be selected up to the limit of the thermoforming resistance of the top resist structures, but preferably at room temperature.

The method of the present invention provides, for the first time the inventors believe, an exact 1:1 structure transfer from a mask onto a wafer in a simple and procedurally reliable manner in a bilayer technique. Particularly in the sub-μm range and given exposures with light of, for example, 248 nm and structural widths of less than 0.5 μm, this has heretofore been the best way of producing structures with a precision of less than ±10% deviation from the mask dimension.

In another embodiment of the method of the present invention, trenches and holes of the treated resist structure can be constricted to such an extent that their width or, respectively, diameter becomes smaller than the resolution limit of the resist or of the method.

By way of example, and not limitation, the method of the invention shall now be set forth below in greater detail with reference to five examples. To that end, two selected compositions for top resist, three compositions for a bulging agent, as well as, the results of preliminary trials relating to the bulging and the etching rates of the combinations deriving from the recited compositions shall be set forth. The method of the invention shall be set forth in greater detail with reference to the figures. The figures illustrate schematic cross-sections through various method stages in the bulging of a top resist structure and the following structure transfer by an anisotropic etching step.

Manufacture of a Top Resist Composition T1

A photoresist T1 was produced by dissolving 16 weight parts ("GT") of a copolymer of allyl trimethylsilane and maleic acid anhydride as a basic polymer and 4 GT of a diester of naphthoquininediazide-4-sulfonic acid with bisphenol A as a photoactive constituent in 80 GT (2-methoxy-1-propyl)-acetate (MPA) as a solvent.

Manufacture of a Top Resist Composition T2

A silicon-free top resist T2 was produced by dissolving 16 GT of a copolymer of styrol and maleic acid anhydride, as well as, 4 GT of the diester used in T1 as a photoactive constituent in 80 GT MPA.

Production of a Bulging Agent A1

A silicon-containing bulging agent A1 was produced by mixing 2.5 GT bis (3-amino propyl)-tetramethyl-disiloxane, 14 GT isopropanol, and 83.5 GT water.

Production of a Bulging Agent A2

A silicon-containing bulging agent A2 was obtained by mixing 8 GT of a linear oligo-dimethylsiloxane with terminal amino propyl groupings, 80 GT isopropanol, and 12 GT water.

Bulging Agent A3

A silicon-free bulging agent A3 was produced by mixing 5 GT 1,10-diaminodecane, 40 GT isopropanol, and 55 GT water.

Preliminary Trial

A thickening of unstructured top resist layers and determination of the etching rates in an $O_2$—RIE etching plasma was performed.

A wafer coated with a 1.8 μm thick and 210° C. annealed layer of the photoresist MP1450J as a planarizing bottom resist was coated by spin-on and subsequent drying at 110° C. with a corresponding top resist. A layer thickness of 0.5 μm arose.

A respective wafer coated with the top resist T1 or, respectively, T2 was respectively immersed for 60 seconds into one of the above bulging agents A1, A2, or A3, was subsequently rinsed for 30 seconds in an isopropanol/water mixture, and was dried. The wafer was etched in an oxygen plasma (6 mTorr gas pressure, 410 volt bias) in a plasma reactor. Table 1, below, sets forth the measured layer growths due to the treatment with the respective bulging agent and also presents the etching rates.

TABLE 1

Layer Growth and Etching Rates

|  | untreated | after 60s treatment in | | |
|---|---|---|---|---|
|  |  | Solution A1 (Containing Silicon) | Solution A2 (Containing Silicon) | Solution A3 (Silicon-Free) |
| Top Resist T1 (containing silicon) | (2.2 nm/min) | 235 nm (1.0 nm/min) | 275 nm (0.4 nm/min) | 243 nm (3.9 nm/min) |
| Top Resist T2 (silicon-free) | (3.6 nm/min) | 190 nm (2.1 nm/min) | 210 nm (0.8 nm/min) | — |

The etching rate of the bottom resist was 28 nm/min.

First Example

A wafer coated as set forth above with the top resist T1 and the bottom resist was contact-exposed through a mask with a dose of 90 mJ/cm$^2$ at 257 nm and was subsequently developed with a developer solution of 1 GT commercially available developer AZ400K, 5 GT water, and 0.5 GT ammonia (40 through 60 seconds) until the structure widths of the top resist structures are respectively 0.1 μm smaller than that prescribed on the mask.

The wafer structured in this fashion was then immersed into the bulging agent A1 until, after rinsing and drying, the identified widths of the expanded top resist structures were respectively 0.05 μm larger than prescribed on the mask. This value was achieved after about 20 through 60 seconds.

The expanded top resist structures were transferred into the bottom resist under the afore-mentioned $O_2$—RIE conditions in the plasma reactor. Table 2, below, compares the identified structure widths of expanded and etched resist structures to the structures prescribed on the mask.

TABLE 2

| | Structure Widths (μm) | | |
|---|---|---|---|
| on the mask | of the developed top resist structures (ridges) | of the expanded top resist structures (ridges) | of the bottom resist structures (ridges) |
| 2.00 | 1.90 | 2.05 | 2.00 |
| 1.00 | 0.90 | 1.05 | 1.00 |
| 0.50 | 0.40 | 0.55 | 0.50 |

Second Example

The first example was repeated with the exception that the solution A2 was used for structure bulging, and the top resist structures are 0.02 μm wider after the bulging than the structures prescribed on the mask. Table 3, below, again compares the measured structure widths to one another.

TABLE 3

| | Structure Widths (μm) | | |
|---|---|---|---|
| on the mask | of the developed top resist structures (ridges) | of the expanded top resist structures (ridges) | of the bottom resist structures (ridges) |
| 2.00 | 1.90 | 2.02 | 2.00 |
| 1.00 | 0.90 | 1.02 | 1.00 |
| 0.50 | 0.40 | 0.52 | 0.50 |

Third Example

A wafer coated and structured in accordance with the first example, was treated with the bulging agent A3 until the expanded structures are 0.1 μm wider than prescribed on the mask. After corresponding etching, the structure widths compared to one another in Table 4, below, were measured.

TABLE 4

| | Structure Widths (μm) | | |
|---|---|---|---|
| on the mask | of the developed top resist structures (ridges) | of the expanded top resist structures (ridges) | of the bottom resist structures (ridges) |
| 2.00 | 1.90 | 2.10 | 2.00 |
| 1.00 | 0.90 | 1.10 | 1.00 |
| 0.50 | 0.40 | 0.60 | 0.50 |

Fourth Example

A wafer coated with T2 was structured in accordance with the first example and was expanded to such an extent with the bulging A1 that the structures were 0.06 μm wider than prescribed on the mask. The identified structure widths of the top and, respectively, bottom resist structures are compared below in Table 5 to the structures prescribed on the mask.

TABLE 5

| | Structure Widths (μm) | | |
|---|---|---|---|
| on the mask | of the developed top resist structures (ridges) | of the expanded top resist structures (ridges) | of the bottom resist structures (ridges) |
| 2.00 | 1.90 | 2.06 | 2.00 |
| 1.00 | 0.90 | 1.06 | 1.00 |
| 0.50 | 0.40 | 0.56 | 0.50 |

Fifth Example

Example 4 was followed with the exception that the bulging agent A2 was used for structure enlargement and bulging produced structures that were 0.04 μm wider than prescribed on the mask. Table 6, below, sets for the identified structure widths.

TABLE 6

| | Structure Widths (μm) | | |
|---|---|---|---|
| on the mask | of the developed top resist structures (ridges) | of the expanded top resist structures (ridges) | of the bottom resist structures (ridges) |
| 2.00 | 1.90 | 2.04 | 2.00 |
| 1.00 | 0.90 | 1.04 | 1.00 |
| 0.50 | 0.40 | 0.54 | 0.50 |

Referring now to the Figures, FIG. 1 illustrates a top resist structure on a substrate 1, for example, a wafer, coated with a planarizing bottom resist 2.

Figure 2:
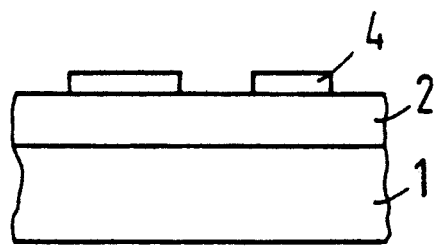
FIG. 2 illustrates a cross-sectional view of the structure after a further step of the method of the present invention.

FIG. 2 illustrates the arrangement after treatment with a bulging agent in accordance with the examples. The expanded top resist structures now have structure widths enlarged by a defined amount in comparison to the mask.

Figure 3:
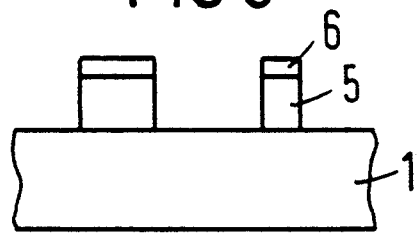
FIG. 3 illustrates a cross-sectional view of the structure after a further step of the method of the present invention.

The bottom resist is now etched in oxygen plasma under anisotropic conditions in those regions not covered by the structures 4. The bottom resist is etched until the substrate is uncovered. The top resist structures 4 acting as a mask thereby shadows regions of the bottom resist layer 2 lying therebelow such that the structures 5 and 6 illustrated in FIG. 3 arise. These are composed of the top resist structures 6 that have proceeded from the top resist structures 4 by etching with a low etching rate. The bottom resist structures 5 lying therebelow and produced by shadowing during the etching now correspond exactly to the structures prescribed on the mask.

As illustrated by the examples and from the tables representing the results thereof, the method of the invention can be set so exactly that an exact 1:1 structure transfer from mask onto top resist structures is possible. As required, of course, a further dimensional reserve can be set in the generated bottom resist structures in order to compensate for dimensional loss in a following etching (not shown) of the wafer with the bottom resist structures as contact mask.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for a dimensionally accurate photolithographic transfer of sub-μm structures in a bilayer technique comprising the steps of:
   applying a first planarizing resist layer on a substrate in a layer thickness that allows an adequately planar surface to be achieved;
   applying a photolithographically structurable, second resist layer on the first, planarizing resist layer, the second resist layer comprising anhydride groups as reactive groups;
   exposing and developing the second resist layer in desired regions for generating a structure, the second resist including reactive groups;
   subjecting a resultant structure so produced to chemical treatment with a bulging agent that causes a bulging of the second resist structures, the bulging agent comprises a medium containing at least water and at least two amino groups as reactive groups, the medium being selected from the group consisting of solutions, emulsions, and solvents; and
   using an anisotropic plasma etching process for transferring the second resist structure into the first resist layer using the structure of the second resist layer as an etching mask.

2. The method of claim 1 wherein a dimensional reserve is produced by the bulging of the resist structure that exactly corresponds to a dimensional loss that results from the structure transfer from the second into the first resist layer.

3. The method of claim 1 wherein the extent of the bulging of the second resist structures is controlled via the duration of the chemical treatment.

4. The method of claim 1 wherein the chemical treatment is performed with a solution that contains a bulging agent.

5. The method of claim 1 wherein the chemical treatment is performed with an emulsion that contains a bulging agent.

6. The method of claim 1 wherein the chemical treatment is used in the vapor phase.

7. The method of claim 1 wherein the chemical treatment of the second resist layer proceeds with a composition containing a bulging agent in a spray, puddle, or immersion developer.

8. The method of claim 1 wherein the degree of the bulging is controlled via the concentration of the bulging agent.

9. The method of claim 1 wherein the chemical treatment is implemented with a bulging agent that contains at least one functional group.

10. The method of claim 9 wherein the bulging agent includes a constituent that increases the etching resistance of the resist to an oxygen/RIE plasma.

11. The method of claim 9 wherein the bulging agent includes silicon-containing radicals.

12. The method of claim 1 wherein the resist of the second resist layer contains a component that increases the etching resistance, and the chemical treatment is implemented with an bulging agent that does not contain such a component.

13. The method of claim 1 wherein a resist is used for the second resist layer that comprises at least one functional group per molecule for reaction with the bulging agent, the functional group being selected from the group consisting of anhydride, imide, ester, amide, ketene, amine, oxirane, phenol, thioester, urethane, and carbonic acid.

14. The method of claim 11 wherein an amino siloxane having 1 to 50 silicon atoms is used as the bulging agent for a second resist containing anhydride.

15. The method of claim 11 wherein an amino siloxane having 2 to 12 silicon atoms is used as the bulging agent for the second resist containing anhydride.

16. The method of claim 1 wherein the bulging agent contains at least one functional group for reaction with the polymer of the second resist, the functional group being selected from the group consisting of alcohol, amine, thiole, carbonic acid, glycidylether, anhydride, imide, isocyanate, urethane, and ketene.

17. The method of claim 1 wherein the second resist structure contains trenches and holes that are constricted by a bulging of said second resist structure such that their width lies below a normal resolution limit.

18. The method of claim 1 further comprising a floodlighting step to be implemented before the chemical treatment for increasing the expansion rate in the chemical treatment.

19. The method of claim 1 wherein the chemical treatment is controlled by controlling the temperature.

20. A method for photolithographic transfer of structures in a bilayer technique comprising the steps of:
applying a first resist layer on a substrate;
applying a photolithographically structurable, second resist layer on the first resist layer, the second resist layer comprising anhydride groups as reactive groups;
exposing and developing the second resist layer in desired regions for generating a structure, the second resist including reactive groups;
subjecting a resultant structure so produced to chemical treatment with a bulging agent that causes at least a lateral expansion of the second resist structures, the agent comprises a medium containing at least water and at least two amino groups as reactive groups, the medium being selected from the group consisting of solutions, emulsions, and solvents; and
using an anisotropic plasma etching process for transferring the second resist structure into the first resist layer using the structure of the second resist layer as an etching mask.

* * * * *